United States Patent [19]

Sugihara et al.

[11] Patent Number: 5,705,089
[45] Date of Patent: *Jan. 6, 1998

[54] CLEANING FLUID FOR SEMICONDUCTOR SUBSTRATE

[75] Inventors: Yasuo Sugihara, Kashiwa; Kazushige Tanaka, Tokyo; Ikue Sakuma, Koshigaya, all of Japan

[73] Assignee: Mitsubishi Gas Chemical Company, Inc., Tokyo, Japan

[*] Notice: The term of this patent shall not extend beyond the expiration date of Pat. No. 5,302,311.

[21] Appl. No.: 29,382

[22] Filed: Mar. 10, 1993

[30] Foreign Application Priority Data

Mar. 11, 1992 [JP] Japan ............................ 4-52580
Sep. 25, 1992 [JP] Japan ............................ 4-256718

[51] Int. Cl.$^6$ ............... H01L 21/304; H01L 21/306
[52] U.S. Cl. ............... 252/79.1; 252/79.2; 252/79.3; 252/79.4; 252/79.5
[58] Field of Search ............... 252/79.1, 79.2, 252/79.5, 79.4, 79.3; 134/2; 156/662.1

[56] References Cited

U.S. PATENT DOCUMENTS 5,290,361  3/1994  Hayashida et al. ............... 134/2
5,302,311  4/1994  Sugihara et al. ............... 252/102

FOREIGN PATENT DOCUMENTS

| 0528053 | of 0000 | European Pat. Off. |
| 0276774 | 8/1988 | European Pat. Off. |
| 0432776 | 6/1991 | European Pat. Off. |
| 3822350A1 | of 0000 | Germany. |
| 3114309 | 10/1982 | Germany. |
| 3215966 | 11/1983 | Germany. |
| 223725 | 6/1985 | Germany. |
| 49098731 | 9/1974 | Japan. |
| 03079778 | 4/1991 | Japan. |
| 1708976 | 1/1992 | U.S.S.R. |

OTHER PUBLICATIONS

Patent Abstracts of Japan vol. 14 No. 131 (C-700)1990 & JP-A-20 04 991 (Kita Kazuo).
Database WPIL Week 9251, Derwent Publications Ltd., London, GB; AN 92-422641 & SU-A-1 708 976 (MOSC Textile INST) 30 Jan. 1992.

Primary Examiner—R. Bruce Breneman
Assistant Examiner—George Goudreau
Attorney, Agent, or Firm—Sherman and Shalloway

[57] ABSTRACT

An acidic or basic hydrogen peroxide cleaning fluid for cleaning a semiconductor substrate, comprising a phosphonic acid chelating agent and a wetting agent, or comprising a wetting agent alone.

18 Claims, No Drawings

CLEANING FLUID FOR SEMICONDUCTOR SUBSTRATE

BACKGROUND OF THE INVENTION (FIELD OF UTILIZATION IN INDUSTRY)

The present invention relates to a cleaning fluid for a semiconductor substrate. More particularly, the present invention relates to an improved cleaning fluid useful in cleaning a semiconductor substrate with a hydrogen peroxide cleaning fluid.

DESCRIPTION OF THE PRIOR ART & PROBLEMS THE PRESENT INVENTION AIMS TO SOLVE

In a fabrication process for fabricating a semiconductor device, semiconductor substrate such as silicon wafers are cleaned with chemicals in order to remove contaminant substances such as metals, organic substances, and fine particles attached on the surface thereof. As such a cleaning fluid, those containing hydrogen peroxide as a main ingredient are used frequently. There have been known, for example, a mixed aqueous solution containing hydrochloric acid and hydrogen peroxide, a mixed aqueous solution containing sulfuric acid and hydrogen peroxide, a mixed aqueous solution containing hydrofluoric acid and hydrogen peroxide, and a mixed aqueous solution containing ammonia and hydrogen peroxide, etc.

In particular, a mixed aqueous solution containing ammonia and hydrogen peroxide which is basic in nature has been used most widely since it is effective in removing fine particles adhering on the surface of a substrate.

On the other hand, according as high integration of semiconductor proceeds, degree of cleanness of substrate surfaces is becoming much sever, which requires increase of cleaning power of cleaning fluids. As a matter of course, chemicals used in the cleaning fluid must be highly purified, and it is usual that metal impurities in each chemical must be controlled to 1 ppb or less. However, if cleaning was performed using such a highly purified chemical, in fact, adherence of a minute amount of a metal on the surface of a substrate has been inevitable due to contaminations from the environment, vessels, etc., and that of readherence of metals once removed from the substrate. Metals at stake are heavy metals such as iron, copper, and nickel. Adherence of these metals change the lifetime of minority carriers and cause lattice defects in the substrate, and therefore gives a great influence on the electrical properties of the semiconductor devices. In particular, iron adheres strongly to a substrate in a basic cleaning fluid such as a mixed aqueous solution of ammonia and hydrogen peroxide, and has been at stake. While with an acidic cleaning fluid the amount of a metal adhering to the substrate decreases, copper still tends to adhere in a mixed aqueous solution of hydrofluoric acid and hydrogen peroxide, which causes a problem.

As described above, since trace amount of metals adhering on the surface of the substrate gives an adverse influence on the electrical properties of a semiconductor device, that amount must be as small as possible, and it is pointed out that nowadays when high integration of semiconductor devices have already proceeded considerably, the amount of metals adhering must be as low as below lower limit of detection of a TREX (Total Reflection Energy Dispersive X-ray Fluorescence) apparatus widely used in a analysis of the amount of adhering metals.

DE-A-3822350 described attempts to decrease the amount of adhering metal impurities by the addition of an additive to a hydrogen peroxide cleaning fluid. In the publication, the addition of ethylenediaminetetracarboxylic acid (ETDA), which is a chelating agent, is proposed. In fact, however, the addition of EDTA gave almost no effect. In contrast, the present inventors found that some phosphonic acid chelating agents are effective for suppressing the adherence of metals as described in Japanese Patent Application No. 55736/1991. The addition of such a phosphonic acid chelating agent decreases the amount of adhering metals considerably to thereby improve the yield of fabrication of semiconductor devices greatly. However, even the addition of the phosphonic acid chelating agent failed to achieve suppression of the adherence of metals to a level of at most $1 \times 10^{10}$ atoms/cm$^2$. Therefore, there has been a keen desire for an improve countermeasure.

SUMMARY OF THE INVENTION

The present inventors have made extensive investigation with view to obtaining a novel hydrogen peroxide cleaning fluid for cleaning semiconductor substrates which fluid gives an amount of metals adhering on the surface of a substrate is at most $1 \times 10^{10}$ atoms/cm$^2$. As a result, they have now found that a cleaning fluid containing a wetting agent which improves the wetness of the cleaning fluid to the surface of a substrate in addition to a phosphonic acid chelating agent can decrease the amount of metals adhering to the surface of the substrate to a level of at most $1 \times 10^{10}$ atoms/cm$^2$. On the other hand, they also have found that although simultaneous use of a phosphonic acid chelating agent and a wetting agent can decrease the amount of metals adhering on the surface of the substrate to a level of at most $1 \times 10^{10}$ atoms/cm$^2$ the use of a surfactant as the wetting agent will lead to new problems of foamability of the cleaning fluid and adherence and retention of the surfactant on the surface of the substrate.

That is, the adherence of the surfactant to the substrate is ascribable to hydrophobic groups (oleophilic groups) of the surfactant, and generally the greater the proportion of the hydrophobic groups, the stronger their adherence to the substrate. The adhering surfactant could not be removed completely by subsequent rinsing with ultrapure water, and becomes a cause of forming silicon carbide in the step of oxidation of the substrate. Formation of silicon carbide gives an adverse influence on the electrical properties of a semiconductor device, for example, deteriorating pressure resistance of oxide film.

The present inventors have now found that among the wetting agents, in particular polyhydric alcohols represented by general formula (I) below

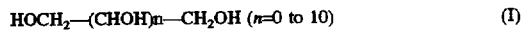

$$HOCH_2-(CHOH)_n-CH_2OH \ (n=0 \text{ to } 10) \qquad (I)$$

or its oxidant have high hydrophilicities and can readily be removed with ultrapure water, and hence they cause no problem of their adherence and retention on the surface of a substrate, and also that they are wetting agents which can solve the problem of forming upon cleaning since they give less foaming at the time of cleaning substrates, and the use of them wetness of the cleaning fluid increases greatly, thus strengthening the cleaning power of the cleaning fluid. Further, the present inventors have found that an acidic or basic hydrogen peroxide cleaning fluid containing as a wetting agent the aforementioned polyhydric alcohol or its oxidant is a novel cleaning fluid for cleaning semiconductor substrates which causes no foaming at the time of cleaning substrates nor adherence and retention of the wetting agent on the substrate in the absence of a phosphonic acid chelating agent, and which has an excellent ability of removing particulates on the substrate although the ability of removing metal impurities is somewhat lower than the case where a phosphonic acid chelating agent is used.

That is, a first object of the present invention it to provide a novel hydrogen peroxide cleaning fluid for semiconductor substrates which can decrease the amount of metals adhering on the surface of a substrate after cleaning to a level of at most $1\times10^{10}$ atoms/cm$^2$.

A second object of the present invention is to provide a novel hydrogen peroxide cleaning fluid for semiconductor substrates which is a good wetting agent and is free of retension of a wetting agent in the cleaning fluid on the surface of a substrate.

Further, a third object of the present invention is to provide a novel hydrogen peroxide cleaning fluid for semiconductor substrates which is free of retention of a wetting agent in the cleaning fluid on the surface of a substrate, causes no foaming at the time of cleaning, and has an excellent ability of removing particulates on the substrate.

DETAILED DESCRIPTION OF THE INVENTION

That is, as a first embodiment, the present invention provides an acidic or basic hydrogen peroxide cleaning fluid for cleaning semiconductor substrates, comprising a phosphonic acid chelating agent and a wetting agent.

As a second embodiment, the present invention provides an acidic or basic hydrogen peroxide cleaning fluid for cleaning semiconductor substrates, comprising at least one wetting agent selected from a polyhydric alcohol represented by general formula (I)

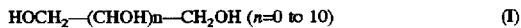

$$HOCH_2—(CHOH)n—CH_2OH \quad (n=0 \text{ to } 10) \qquad (I)$$

or its oxident, and a wetting agent.

Now, the present invention will be described in detail hereinbelow. First, in the first embodiment of the present invention, the phosphonic acid chelating agent to be used is not limited particularly so far as it is a chelating agent having at least two phosphonic acid groups. Representative examples of such a chelating agent includes aminotri (methylenephosphonic acid), 1-hydroxyethylidene-1,1-diphosphonic acid, ethylenediaminetetra (methylenephosphonic acid), hexamethylenediaminetra (methylenephosphonic acid), propylenediaminetetra (methylenephosphonic acid), diethylenetriaminepenta (methylenephosphonic acid), triethylenetetraminehexa (methylenephosphonic acid), triaminotriethylaminehexa (methylenephosphonic acid), trans-1,2-cyclohexanediaminetetra(methylenephosphonic acid), glycol ether diaminetetra(methylenephosphonic acid), and tetraethylenepentaminehepta(methylenephosphonic acid). These chelating agents which can be used in the present invention may be used preferably in the form of free acid. However, they may also be used in the form of salt such as ammonium salt or the like when they have insufficient solubilities.

The amount of the phosphonic acid chelating agent is not limited particularly and usually it is 1 ppb to 1,000 ppm based on total amount of the cleaning fluid. The phosphonic acid chelating agent may be added to a cleaning fluid which has been prepared in advance, or it may be added to one or more of hydrogen peroxide, water, ammonia, organic amines, hydrochloric acid, sulfuric acid, hydrofluoric acid, etc. in advance followed by mixing these components to prepare a cleaning fluid.

Next, examples of the wetting agent which can be used in the present invention include anionic surfactants such as sulfonic acid surfactants, sulfate surfactants, phosphate surfactants, fatty acid surfactants, and polycarboxylic acid surfactants, etc.; cationic surfactants such as amine surfactants, and quaternary ammonium salt surfactants, etc.; nonionic surfactants such as ethylene oxide added surfactants, ethylene oxide propylene oxide copolymer surfactants, and glycerol ester surfactants, etc.; etc. Also, there may be used fluorinated surfactants obtained by partially fluorinating the aforementioned surfactants. Further, any water-soluble organic additives that can improve the wetness of a cleaning agent on the surface of a substrate may be used as a wetting agent in the present invention.

Specific examples of the water-soluble organic additive which can be used as a wetting agent in the present invention include alcohols such as ethanol, isopropanol, triethylene glycol monomethyl ether, and triethylene glycol monoethyl ether, etc.; glycols such as ethylene glycol, and propylene glycol, etc.; carboxylic acids such as acetic acid, propionic acid, and enanthic acid, etc.; hydroxycarboxylic acids such as glycolic acid, tartaric acid, and citric acid, etc.; polycarboxylic acids such as polyacrylic acid, polymethacrylic acid, polymaleic acid, and copolymerizate thereof, etc.; polyhydric alcohols such as glycerol, sorbitol, and polyvinyl alcohol, or their oxidants, etc.; and the like.

Of these wetting agents, particularly preferred ones are polyhydric alcohols represented by general formula (I) above or their oxidized substances referred to in the second embodiment of the present invention. Specific examples of such polyhydric alcohol include ethylene glycol, glycerol, erythritol, xylitol, sorbitol, mannitol, etc.

The oxidized substances of the polyhydric alcohols are those obtained by substituting one or both terminal —CH$_2$OH groups of the polyhydric alcohol represented by general formula (I) with a —CHO group or a —COOH group. Specific examples thereof include glycol aldehyde, glycolic acid, glyoxal, oxalic acid, glyeric acid, glucose, tartaric acid, etc.

Further, the oxidized substances of the polyhydric alcohols include those obtained by substituting a part or all of —CHOH— groups in the polyhydric alcohol represented by general formula (I) with a —CO— group. Specific examples thereof include dioxyacetone, fructose, etc. As indicated in the second embodiment, these polyhydric alcohols or their oxidized substances when added alone (not in combination with phosphonic acid chelating agents) to a cleaning fluid can exhibit excellent cleaning power as described above.

While the content of the wetting agent is not limited particularly, it is preferred that the wetting agent is contained in a cleaning fluid in such a concentration that the surface tension of the cleaning fluid is 60 dyne/cm or less, or the contact angle of the cleaning fluid to the surface of a substrate is 50° or less. Usually, the content of the wetting agent is 1 to 15,000 ppm based on the cleaning fluid.

The wetting agent may be added to a cleaning fluid which has been prepared in advance, or it may be added to one or more of hydrogen peroxide, water, ammonia, organic amines, hydrochloric acid, sulfuric acid, hydrofluoric acid, etc. in advance followed by mixing these components to prepare a cleaning fluid.

Also, a wetting agent may be used two or more of them may be used in combination.

Next, the second embodiment of the present invention will be described in detail. The polyhydric alcohols represented by general formula (I) or their oxidized substances may be used singly or two or more of them may be used in combination.

The content of the polyhydric alcohols or their oxidants may be 0.1 to 15,000 ppm, and preferably 1 to 1,000 ppm, based on the cleaning fluid. If the content is less than 0.1 ppm, no sufficient effect can be obtained while if it is above 15,000 ppm, no effect corresponding to such amount can be obtained.

In particular, the polyhydric alcohols represented by general formula (I) or their oxidized substances are featured that they increase the wetness of the cleaning fluid greatly in a relatively small amount as compared with similar polyhydric alcohols or their oxidized substances.

The polyhydric alcohols represented by general formula (I) or their oxidized substances may be added to an acidic or basic cleaning fluid which has been prepared in advance, or they may be added to one or more of hydrogen peroxide, ammonia water, hydrochloric acid, sulfuric acid, hydrofluoric acid, water, etc. in advance followed by mixing these components to prepare a cleaning fluid. When they are added to hydrogen peroxide in advance, preferred amount of addition is 1 to 1,000 ppm.

In the cleaning fluid for cleaning semiconductor substrates according to the present invention, a mixed aqueous solution of ammonia and hydrogen peroxide which contains (a) a phosphonic acid chelating agent and a wetting gent, or (b) the wetting agent represented by general formula (I) alone, has particularly improved cleaning action for semiconductor substrates. In this case, as the compositions of ammonia and hydrogen peroxide in the mixed aqueous solution, usually preferred concentration of ammonia is 0.1 to 10% by weight, and that of hydrogen peroxide is 0.1 to 30% by weight.

Further, the cleaning fluid for cleaning semiconductor substrates according to the present invention includes those solutions obtained by adding a phosphonic acid chelating agent and a wetting agent, or the wetting agent represented by general formula (I) alone, to a mixed aqueous solution containing choline (hydroxyltrimethylammonium hydroxide) and hydrogen peroxide, a mixed aqueous solution containing TMAH (tetramethylammonium hydroxide) and hydrogen peroxide, a mixed aqueous solution containing hydrofluoric acid and hydrogen peroxide, a mixed aqueous solution containing hydrochloric acid and hydrogen peroxide, a mixed aqueous solution containing sulfuric acid and hydrogen peroxide, etc.

EFFECT OF THE INVENTION

The use of the cleaning fluid for cleaning semiconductor substrates according to the present invention enables effective cleaning of semiconductor substrates such that the amount of metals adhering to the surface of a substrate is at most $1 \times 10^{10}$ atoms/cm$^2$.

In the case where the polyhydric alcohols represented by general formula (I) or their oxidized substances are used as a wetting agent, the wetness of the cleaning fluid to the surface of a semiconductor substrate is improved, and the polyhydric alcohols or their oxidized substances will not adhere nor remain on the surface of the substrate, and hence semiconductor devices derived from the semiconductor substrates cleaned by the use of such a cleaning fluid will be free from adverse effects on electrical properties that will be otherwise encountered when the substrates cleaned with the conventional cleaning fluids.

The cleaning fluid of the present invention has similar excellent effects for cleaning semiconductor devices with substrates on which circuits have been formed.

EXAMPLES

Hereinafter, the present invention will be described in more detail by examples and comparative examples.

Example 1

High purity ammonia (286 by weight), high purity hydrogen peroxide (30% by weight) and ultrapure water were mixed in proportions of 1:4:20 by weight, and one or more additives shown in Table 1 were added to the resulting mixture to prepare a cleaning fluid. A precleaned silicon substrate of 3 inches in diameter was dipped in the cleaning fluid thus obtained at 85° C. for 10 minutes for cleaning. After rinsed with ultrapure water, the substrate was air-dried. This was examined for analysis of the amount of iron or copper adhering thereto by using TREX (Total Reflection Energy Dispersive X-ray fluorescence). At the same time, surface tension of the cleaning fluid at 85° C. and contact angle of the cleaning fluid to the substrate were measured. Further, the contents of iron and copper, respectively, in the cleaning fluid just after the preparation were determined by atomic absorption spectroscopy. Here, Tensiometer Type CBVP-A3 (Wilhelmy's method, KYOWA KAIMEN KAGAKU Co., Ltd.) was used for the measurement of surface tension. Contact angle was measured using a contact angle measuring instrument Type CA-D (Liquid drop method, KYOWA KAIMEN KAGAKU Co., Ltd.) in a state after 10 seconds from the dropping of a liquid. Results obtained are shown in Table 1.

TABLE 1

| Test | | Amount of Metal in Cleaning Fluid | | Surface Tension of Cleaning Fluid | Contact Angle of Cleaning Fluid | Amount of Metal Adhering to Substrate ($10^{10}$ atoms/cm$^2$) | |
|---|---|---|---|---|---|---|---|
| No. | Additive | Fe (ppb) | Cu (ppb) | (dyne/cm) | (degree) | Fe | Cu |
| (1) | None | 0.4 | 0.1 | 65 | 59 | 120 | 5 |
| (2) | EDTMP 10 ppb | 0.4 | 0.1 | 64 | 59 | 5 | 3 |
| (3) | EDTMP 10 ppm | 0.4 | 0.1 | 65 | 58 | 4 | 3 |
| (4) | EDTMP 10 ppb ABSA 100 ppm | 0.6 | 0.2 | 61 | <5 | <1 | <1 |
| (5) | EDTMP 10 ppb ABSA 10 ppm | 0.5 | 0.1 | 62 | 51 | 3 | 2 |
| (6) | EDTMP 10 ppm PAA 100 ppm | 0.7 | 0.1 | 60 | 49 | <1 | <1 |
| (7) | EDTMP 10 ppm 2-EHD 500 ppm | 0.5 | 0.1 | 58 | 45 | <1 | <1 |

TABLE 1-continued

| Test No. | Additive | Amount of Metal in Cleaning Fluid | | Surface Tension of Cleaning Fluid (dyne/cm) | Contact Angle of Cleaning Fluid (degree) | Amount of Metal Adhering to Substrate ($10^{10}$ atoms/cm$^2$) | |
|---|---|---|---|---|---|---|---|
| | | Fe (ppb) | Cu (ppb) | | | Fe | Cu |
| (8) | 2-EHD 500 ppm | 0.5 | 0.1 | 58 | 44 | 95 | 4 |
| (9) | PDTMP 10 ppb | 0.4 | 0.1 | 65 | 58 | 1 | 2 |
| (10) | PDTMP 10 ppb EG 100 ppm | 0.4 | 0.1 | 63 | 20 | <1 | <1 |
| (11) | PDTMP 10 ppb GA 500 ppm | 0.5 | 0.1 | 62 | 31 | <1 | <1 |
| (12) | PDTMP 10 ppb Glycol 500 ppm | 0.5 | 0.1 | 61 | 22 | <1 | <1 |
| (13) | PDTMP 10 ppb Sorbitol 500 ppm | 0.6 | 0.1 | 63 | 34 | <1 | <1 |
| (14) | DETMP 10 ppm ABSA 100 ppm | 0.7 | 0.1 | 60 | <5 | <1 | <1 |

Notes:
In Table 1, EDTMP designates ethylenediaminetetra(methylenephosphonic acid), PDTMP propylenetriaminetetra(methylenephosphonic acid), DETMP diethylenediaminepenta (methylenephosphonic acid), ABSA alkylbenzenesulfonic acid, PAA polyacrylic acid, 2-EHD 2-ethyl-1,3-hexanediol, EG ethylene glycol, and GA glycolic acid. As the alkylbenzenesulfonic acid and polyacrylic acid, there were used LIPON LH-500, LION Co., Ltd. and POIZ 520, KAO Co., Ltd., respectively.
Test Nos. 1, 2, 3, 5, 8 and 9 were for comparison.

Example 2

High purity hydrofluoric acid (50% by weight), high purity hydrogen peroxide (30% by weight) and ultrapure water were mixed in proportions of 1:15:85 by weight, and one or more additives shown in Table 2 were further added to the resulting mixture to prepare a cleaning fluid. A precleaned silicon substrate of 3 inches in diameter was dipped in the cleaning fluid thus obtained at 30° C. for 10 minutes for cleaning. After rinsed with ultrapure water, the substrate was air-dried. This was examined for analysis of the amount of iron or copper adhering thereto by using TREX (Total Reflection Energy Dispersive X-ray fluorescence). At the same time, surface tension of the cleaning fluid at 30° C. and contact angle of the cleaning fluid to the substrate were measured. Further, the contents of iron and copper, respectively, in the cleaning fluid just after the preparation were determined by atomic absorption spectroscopy. Results obtained are shown in Table 2.

TABLE 2

| Test No. | Additive | Amount of Metal in Cleaning Fluid | | Surface Tension of Cleaning Fluid (dyne/cm) | Contact Angle of Cleaning Fluid (degree) | Amount of Metal Adhering to Substrate ($10^{10}$ atoms/cm$^2$) | |
|---|---|---|---|---|---|---|---|
| | | Fe (ppb) | Cu (ppb) | | | Fe | Cu |
| (9) | None | 0.3 | 0.1 | 70 | 81 | 1 | 3 |
| (10) | DTPMP 1 ppm | 0.3 | 0.1 | 70 | 80 | 1 | 1 |
| (11) | DTPMP 1 ppm PEG alkyl phenyl ether 100 ppm | 0.5 | 0.1 | 28 | <5 | <1 | <1 |

Notes:
In Table 2, DTPMP designates diethylenetriaminepenta(methylenephosphonic acid). PEG alkyl phenyl ether designates polyethylene glycol alkyl phenyl ether. As polyethylene glycol alkyl phenyl ether, there was used EMALGEN 147 (KAO Co., Ltd.).
Test Nos. 9 and 10 were for comparison.

Examples 3 to 12

Hydrogen peroxide (31%), ammonia water (28%) and ultrapure water were mixed in proportions of 4:1:20 by volume, to which was added of various additives shown in Table 3 in a predetermined amount to prepare cleaning fluids.

The contact angel of each of the cleaning fluid to a silicon substrate at 85° C. was measured by using a contact angle measuring instrument Type CA-D (Liquid drop method, KYOWA KAIMEN KAGAKU Co., Ltd.). As the silicon substrate, there was used one of which native oxide was removed by treatment with diluted hydrofluoric acid. The contact angle was measured in a state after 10 seconds from the dropping of a liquid. Results obtained are shown in Table 3.

Comparative Examples 1 to 5

The same procedures as in Examples 3 to 12 were repeated except that additives were changed to those shown in Table 3. Results obtained are shown in Table 3.

Comparative Example 6

The same procedures as in Examples 3 to 12 were repeated except that a cleaning fluid containing no additive was used. Results obtained are shown in Table 3.

TABLE 3

| Run No. | Additive | Amount (ppm) | Contact Angle (degree) |
|---|---|---|---|
| Example 3 | Ethylene glycol | 500 | 27 |
| Example 4 | Ethylene glycol | 100 | 19 |
| Example 5 | Ethylene glycol | 5 | 27 |
| Example 6 | Glycolic acid | 500 | 21 |
| Example 7 | Oxalic acid | 500 | 26 |
| Example 8 | Glycerol | 500 | 22 |
| Example 9 | Erythritol | 500 | 23 |
| Example 10 | Xylitol | 500 | 17 |
| Example 11 | Sorbitol | 500 | 29 |
| Example 12 | Tartaric acid | 500 | 27 |
| C. Example 1 | Propylene glycol | 500 | 41 |
| C. Example 2 | Diethylene glycol | 500 | 47 |
| C. Example 3 | 1,6-Hexanediol | 500 | 48 |
| C. Example 4 | Lactic acid | 500 | 51 |
| C. Example 5 | Butyric acid | 500 | 40 |
| C. Example 6 | — | 0 | 58 |

C. Example: Compararative Example

C. Example: Comparative Example

From the results of Examples 3 to 12 and Comparative Examples 1 to 5, it can be seen that the polyhydric alcohols represented by general formula (I) or their oxidized substances exhibit superior wetness to similar wetting agent.

Example 13

Hydrogen peroxide (31%), hydrochloric acid (36%), and ultrapure water were mixed in proportions of 1:1:6 by volume to prepare a cleaning fluid, to which was added ethylene glycol. Using the resulting cleaning fluid similar measurements as in Examples 3 to 12 were performed. Results obtained are shown in Table 4.

Comparative Example 7

Similar procedures as in Example 13 were repeated using no additive. Results obtained are shown in Table 4.

TABLE 4

| | Additive | Amount (ppm) | Contact Angle (degree) |
|---|---|---|---|
| Example 13 | Ethylene glycol | 10,000 | 30 |
| Comparative Example 7 | — | 0 | 57 |

Examples 14 to 16

A silicon substrate of 3 inches in diameter of which native oxide was removed by diluted hydrofluoric acid treatment was dipped in an aqueous solution having dispersed therein silica particles of 0.5 μm in diameter to have the silica particles adhered on the surface of the substrate.

This substrate was dipped in the cleaning fluids prepared in Examples 3 to 12 to which were added additives shown in Table 5 in proportions shown in Table 5, respectively, at 85° C. for 10 minutes for cleaning. Then, after rinsed with ultrapure water, the silicon substrate was examined by using a scanning electron microscope to check effect of removing silica particles on the silicon substrate. Results obtained are shown in Table 5.

Comparative Example 8

Similar procedures as in Examples 14 and 16 were repeated using lactic acid as an additive. Results obtained are shown in Table 5.

Comparative Example 9

Similar procedures as in Examples 14 and 16 were repeated using no additive. Result obtained are shown in Table 5.

TABLE 5

| Run No. | Additive | Amount (ppm) | Number of Particles on Surface of Substrate (number/substrate) Before Cleaning | Number of Particles on Surface of Substrate (number/substrate) After Cleaning | Removal Ratio (%) |
|---|---|---|---|---|---|
| Example 14 | Ethylene glycol | 500 | 486 | 5 | 99 |
| Example 15 | Ethylene glycol | 5 | 486 | 3 | 99 |
| Example 16 | Glycolic acid | 500 | 486 | 5 | 97 |
| Comparative Example 8 | Lactic acid | 500 | 486 | 13 | 97 |
| Comparative Example 9 | — | — | 486 | 15 | 97 |

From the results of Examples 14 to 16 and Comparative Example 8, it can be seen that the use of the polyhydric alcohols represented by general formula (I) or their oxidants as the wetting agent in the present invention considerably increased the ability of removing particulates on the substrate.

Examples 17 to 19

Hydrogen peroxide (31% by weight), ammonia water (28% by weight) and ultrapure water were mixed in proportions of 4:1:20 by weight, and additives shown in Table 6 were further added to the resulting mixture to prepare cleaning fluids. A silicon substrate of 3 inches in diameter of which native oxide was removed with diluted hydrofluoric acid treatment was dipped in the cleaning fluid thus obtained at 85° C. for 10 minutes for cleaning. After rinsed with ultrapure water, this was examined for presence of residual additives based on absorptions of organic substances by using XPS analysis (X-ray Photo Sepctroscopy) and ATR-IR analysis (Attenuated Total Reflection Infrared Sepctroscopy). Results obtained are shown in Table 6.

Comparative Examples 10 and 11

Similar procedures as in Examples 17 and 19 were repeated using polyethylene glycol alkyl ether (surfactant, Comparative Example 10) or alkylbenzenesulfonic acid (surfactant, Comparative Example 11) as an additive. Results obtained are shown in Table 6.

Comparative Example 12

Similar procedures as in Examples 17 and 19 were repeated using a cleaning fluid containing no additive. Results obtained are shown in Table 6.

TABLE 6

|  | Additive | Amount (ppm) | Adherence |
|---|---|---|---|
| Example 17 | Ethylene glycol | 500 | No |
| Example 18 | Ethylene glycol | 50 | No |
| Example 19 | Glycolic acid | 500 | No |
| Comparative Example 10 | Polyethylene glycol alkyl ether | 50 | Yes |
| Comparative Example 11 | Alkylbenzenesulfonic acid | 50 | Yes |
| Comparative Example 12 | — | 0 | No |

From the result of Examples 17 to 19 and Comparative Examples 10 and 11, it can be seen that the wetting agent represented by general formula (I) used in the present invention does not remain on a substrate after cleaning.

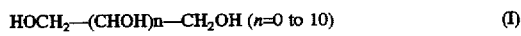

What is claimed is:

1. An acid or basic hydrogen peroxide cleaning fluid composition for cleaning a semiconductor substrate, comprising
   (a) 0.1 to 30 wt % of a hydrogen peroxide,
   (b) 0.1 to 1 wt % of a base selected from the group consisting of ammonia, hydroxyltrimethylammonium hydroxide and tetramethylammonium hydroxide or an inorganic acid selected from the group consisting of hydrochloric acid, sulfuric acid, hydrofluoric acid and a mixture thereof,
   (c) a wetting agent selected from the group consisting of anionic surfactant, cationic surfactant, nonionic surfactant, fluorinated surfactant and a water-soluble organic additive that can improve the wetness of a cleaning agent on the surface of a substrate, in an amount effective to produce a surface tension of the cleaning fluid of 60 dyne/cm or less, or a contact angle of the cleaning fluid to the surface of a substrate of 50° or less, and
   (d) a phosphonic acid chelating agent in an amount of 1 ppb to 1,000 ppm based on the amount of the cleaning fluid.

2. An acid or basic hydrogen peroxide cleaning fluid composition for cleaning a semiconductor substrate, which has a surface tension of 60 dyne/cm or less, or a contact angle of 50° or less with respect to a surface of said substrate, comprising
   (a) 0.1 to 30 wt % of a hydrogen peroxide,
   (b) 0.1 to 10 wt % of a base selected from the group consisting of ammonia, hydroxyltrimethylammonium hydroxide and tetramethylammonium hydroxide or an inorganic acid selected from the group consisting of hydrochloric acid, sulfuric acid, hydrofluoric acid and a mixture thereof,
   (c) a wetting agent which is a sulfonic acid surfactant, in an amount of 1 to 15,000 ppm based on the cleaning fluid, and
   (d) a phosphonic acid chelating agent in an amount of 1 ppb to 1,000 ppm based on the amount of the cleaning fluid.

3. An acid or basic hydrogen peroxide cleaning fluid composition for cleaning a semiconductor substrate, which has a surface tension of 60 dyne/cm or less, or a contact angle of 50° or less with respect to a surface of said substrate, comprising
   (a) 0.1 to 30 wt % of a hydrogen peroxide,
   (b) 0.1 to 10 wt % of a base selected from the group consisting of ammonia, hydroxyltrimethylammonium hydroxide and tetramethylammonium hydroxide or an inorganic acid selected from the group consisting of hydrochloric acid, sulfuric acid, hydrofluoric acid and a mixture thereof,
   (c) a wetting agent which is a ethylene oxide-added nonionic surfactant, in an amount of 1 to 15,000 ppm based on the cleaning fluid, and
   (d) a phosphoric acid chelating agent in an amount of 1 ppb to 1,000 ppm based on the amount of the cleaning fluid.

4. An acid or basic hydrogen peroxide cleaning fluid composition for cleaning a semiconductor substrate, which has a surface tension of 60 dyne/cm or less, or a contact angle of 50° or less with respect to a surface of said substrate, comprising
   (a) 0.1 to 30 wt % of a hydrogen peroxide,
   (b) 0.1 to 10 wt % of a base selected from the group consisting of ammonia, hydroxyltrimethylammonium hydroxide and tetramethylammonium hydroxide or an inorganic acid selected from the group consisting of hydrochloric acid, sulfuric acid, hydrofluoric acid and a mixture thereof,
   (c) a wetting agent which is a polycarboxylic acid or its copolymerization modified product, in an amount of 1 to 15,000 ppm based on the cleaning fluid, and
   (d) a phosphonic acid chelating agent in an amount of 1 ppb to 1,000 ppm based on the amount of the cleaning fluid.

5. An acid or basic hydrogen peroxide cleaning fluid composition for cleaning a semiconductor substrate, which has a surface tension of 60 dyne/cm or less, or a contact angle of 50° or less with respect to a surface of said substrate, comprising
   (a) 0.1 to 30 wt % of a hydrogen peroxide,
   (b) 0.1 to 10 wt % of a base selected from the group consisting of ammonia, hydroxyltrimethylammonium hydroxide and tetramethylammonium hydroxide or an inorganic acid selected from the group consisting of hydrochloric acid, sulfuric acid, hydrofluoric acid and a mixture thereof,
   (c) a wetting agent which is a polyhydric alcohol represented by general formula (I)

$$HOCH_2-(CHOH)_n-CH_2OH \qquad (I)$$

or its oxidized substances, wherein n is 0 to 10, in an amount of 1 to 15,000 ppm based on the cleaning fluid, and (d) a phosphonic acid chelating agent in an amount of 1 ppb to 1,000 ppm based on the amount of the cleaning fluid.

6. An acid or basic hydrogen peroxide cleaning fluid composition for cleaning a semiconductor substrate, which has a surface tension of 60 dyne/cm or less, or a contact angle of 50° or less with respect to a surface of said substrate, comprising (a) 0.1 to 30 wt % of a hydrogen peroxide, (b) 0.1 to 10 wt % of a base selected from the group consisting of ammonia, hydroxyltrimethylammonium hydroxide and tetramethylammonium hydroxide or an inorganic acid selected from the group consisting of hydrochloric acid, sulfuric acid, hydrofluoric acid and a mixture thereof, (c) a wetting agent which is at least one member selected from the group consisting of ethylene glycol, glycerol, sorbitol, glycolic acid, erythritol, xylitol, and mannitol, in an amount of 1 to 15,000 ppm based on the cleaning fluid, and (d) a phosphonic acid chelating agent in an amount of 1 ppb to 1,000 ppm based on the amount of the cleaning fluid.

7. The cleaning fluid for cleaning a semiconductor substrate as claimed in claim 1, wherein said phosphonic acid chelating agent is a member selected from the group consisting of propylenediaminetetra(methylenephosphonic acid), ethylenediaminetetra(methylenephosphonic acid), and diethylenetriaminepenta(methylenephosphonic acid).

8. An acid or basic hydrogen peroxide cleaning fluid composition for cleaning a semiconductor substrate, which has a surface tension of 60 dyne/cm or less, or a contact angle of 50° or less with respect to a surface of said substrate, comprising (a) 0.1 to 30 wt % of a hydrogen peroxide, (b) 0.1 to 10 wt % of a base selected from the group consisting of ammonia, hydroxyltrimethylammonium hydroxide and tetramethylammonium hydroxide or an inorganic acid selected from the group consisting of hydrochloric acid, sulfuric acid, hydrofluoric acid and a mixture thereof, (c) a wetting agent which is water-soluble organic additive selected from the group consisting of alcohols, glycols, carboxylic acids, hydroxylic acids, polycarboxylic acids and polyhydric alcohols, in an amount of 1 to 15,000 ppm based on the cleaning fluid, and (d) a phosphonic acid chelating agent in an amount of 1 ppb to 1,000 ppm based on the amount of the cleaning fluid.

9. An acid or basic hydrogen peroxide cleaning fluid composition for cleaning a semiconductor substrate, which has a surface tension of 60 dyne/cm or less, or a contact angle of 50° or less with respect to a surface of said substrate, comprising (a) 0.1 to 30 wt % of a hydrogen peroxide, (b) 0.1 to 10 wt % of a base selected from the group consisting of ammonia, hydroxyltrimethylammonium hydroxide and tetramethylammonium hydroxide or an inorganic acid selected from the group consisting of hydrochloric acid, sulfuric acid, hydrofluoric acid and a mixture thereof, and (c) a wetting agent selected from a polyhydric alcohol represented by the general formula (I)

$$HOCH_2-(CHOH)n-CH_2OH \ (n=0 \text{ to } 10) \quad (I)$$

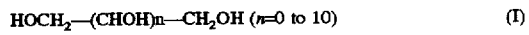

and an oxidation product thereof wherein one or more of the C-hydroxyl groups have been substituted by an aldehyde, carbonyl or carboxyl group, present in an amount of 0.1 to 15,000 ppm based on the cleaning fluid.

10. The cleaning fluid composition for cleaning a semiconductor substrate as claimed in claim 9, wherein said cleaning fluid has (d) a phosphonic acid chelating agent present in an amount of 1 ppb to 1,000 pm based on the cleaning fluid.

11. The cleaning fluid composition for cleaning a semiconductor substrate as claimed in claim 9 wherein said wetting agent is at least one member selected from the group consisting of ethylene glycol, glycerol, sorbitol, glycolic acid, erythritol, xylitol, and mannitol.

12. The cleaning fluid for cleaning a semiconductor substrate as claimed in claim 9, wherein said polyhydric alcohol represented by general formula (I) or an oxidation product thereof wherein one or more of the C-hydroxyl groups have been substituted by an aldehyde, carbonyl or carboxyl group is in an amount of 1 to 1,000 ppm.

13. The cleaning fluid composition of claim 9, wherein said oxidation product is a member selected from the group consisting of glycol aldehyde, glycolic acid, glyoxal, oxalic acid, glyceric acid, glycose, tartaric acid, dioxyacetone and fructose.

14. A basic hydrogen peroxide cleaning fluid composition for cleaning a semiconductor substrate which has a surface tension of 60 dyne/cm or less, or a contact angle of 50° or less with respect to a surface of said substrate, comprising (a) 0.1 to 30 wt % of a hydrogen peroxide, (b) 0.1 to 10 wt % of a base selected from the group consisting of an ammonia, hydroxyltrimethylammonium hydroxide and tetramethylammonium hydroxide, and (c) a wetting agent selected from a polyhydric alcohol represented by the general formula (I)

$$HOCH_2-(CHOH)n-CH_2OH \ (n=0 \text{ to } 10) \quad (I)$$

and an oxidation product thereof wherein one or more of the C-hydroxyl groups have been substituted by an aldehyde, carbonyl or carboxyl group, present in an amount of 1.0 to 15,000 ppm based on the cleaning fluid.

15. The cleaning fluid composition for cleaning a semiconductor substrate as claimed in claim 14, wherein said cleaning fluid has (d) a phosphoric acid chelating agent present in an amount of 1 ppb to 1,000 pm based on the cleaning fluid.

16. The cleaning fluid composition for cleaning a semiconductor substrate as claimed in claim 14 wherein said wetting agent is at least one member selected from the group consisting of ethylene glycol, glycerol, sorbitol, glycolic acid, erythritol, xylitol, and mannitol.

17. The cleaning fluid composition for cleaning a semiconductor substrate as claimed in claim 14, wherein said polyhydric alcohol represented by the general formula (I) or an oxidation product thereof wherein one or more of the C-hydroxyl groups have been substituted by an aldehyde, carbonyl or carboxyl group is in an amount of 1 to 1000 ppm.

18. The cleaning fluid composition of claim 14, wherein said oxidation product is a member selected form the group consisting of glycol aldehyde, glycolic acid, glyoxal, oxalic acid, glyceric acid, glycose, tartaric acid dioxyacetone and fructose.